United States Patent [19]
Werrbach

[11] Patent Number: 5,848,167
[45] Date of Patent: Dec. 8, 1998

[54] DISTRIBUTED PRE-EMPHASIS EQUALIZER

[75] Inventor: Donn R. Werrbach, Glendale, Calif.

[73] Assignee: Aphex Systems, Ltd., Sun Valley, Calif.

[21] Appl. No.: 819,002

[22] Filed: Mar. 17, 1997

[51] Int. Cl.⁶ .................................................. H03G 5/00
[52] U.S. Cl. ................. 381/98; 381/4; 333/28 R
[58] Field of Search ............................ 381/98, 101, 102, 381/103, 106, 3, 4, 13; 333/28 T, 28 R

[56] References Cited

U.S. PATENT DOCUMENTS

| | | |
|---|---|---|
| 4,208,548 | 6/1980 | Orban . |
| 4,241,266 | 12/1980 | Orban . |
| 4,525,857 | 7/1985 | Orban . |
| 5,168,526 | 12/1992 | Orban . |
| 5,315,660 | 5/1994 | Anderson et al. ........................ 381/106 |

Primary Examiner—Forester W. Isen
Attorney, Agent, or Firm—Thomas I. Rozsa; Tony D. Chen; Jerry Fong

[57] ABSTRACT

A distributed pre-emphasis equalizer comprises a partial pre-emphasizer and a (50) microsecond pre-emphasizer. The partial pre-emphasizer receives an input signal and produces a partially pre-emphasized output signal. The (50) microsecond pre-emphasizer receives the partially pre-emphasized output signal from the partial pre-emphasizer and adds a (50) microsecond equalization to produce a pre-emphasized output signal equal to a standard (75) microsecond pre-emphasis curve. The distributed pre-emphasis equalizer allows an FM audio processor to produce only the "dulling" effect of a (50) microsecond pre-emphasis even when generating a (75) microsecond pre-emphasis curve. The distributed pre-emphasis equalizer also creates a pre-emphasizing method which is inherently compatible with both the (75) microsecond and (50) microsecond standards. Furthermore, the distributed pre-emphasis equalizer creates a pre-emphasizing method which is easily switchable between the (75) and (50) microsecond standards.

17 Claims, 5 Drawing Sheets

DISTRIBUTED PRE-EMPHASIS EQUALIZER

BACKGROUND OF THE INVENTION

1. Field of the Invention

The present invention generally relates to the field of audio signal processing. More particularly, the present invention relates to the field of audio signal processing for FM transmission. In particular, the present invention relates to the field of audio frequency pre-emphasis of signals for FM transmission.

2. Description of the Prior Art

Specifically, FM broadcasting carries a regulatory requirement for audio pre-emphasis. In the United States, the specification is a high frequency boost according to the curve defined by a (75) microsecond first order network. Hence, the pre-emphasis is specified in microseconds, i.e., (75) microsecond pre-emphasis. The (75) microsecond standard has been adopted in certain other parts of the world, but Europe and many non European countries have adopted a (50) microsecond standard.

Broadcasters wish to maintain a loud and competitive sound at the listener's FM radio. This requires keeping an abnormally high average modulation and stopping all audio peaks from exceeding 100% modulation at all times. Relatively aggressive audio processors especially designed for FM transmission are used by broadcasters to achieve this goal. In constructing audio processing equipment, it has been found that the pre-emphasis curve causes difficulties for limiting the peak modulation while maintaining high average modulation at middle and bass frequencies which should ideally be able to achieve 100% modulation on their own account. One noticeable effect which seems endemic to FM audio processing is the "dulling" of the sound due to the peak limiter's frequent but necessary attenuation of the pre-emphasized frequencies as it keeps all peaks, regardless of frequency, at or below 100% modulation.

The following prior art patents are found to be pertinent to the field of the present invention:

1. U.S. Pat. No. 4,208,548 issued to Orban on Jun. 17, 1980 for "Apparatus And Method For Peak-Limiting Audio Frequency Signals" (hereafter "the '548 Orban Patent");
2. U.S. Pat. No. 4,241,266 issued to Orban on Dec. 23, 1980 for "Peak Limiting Apparatus For Audio Signal" (hereafter "the '266 Orban Patent");
3. U.S. Pat. No. 4,525,857 issued to Orban on Jun. 25, 1985 for "Crossover Network" (hereafter "the '857 Orban Patent"); and
4. U.S. Pat. No. 5,168,526 issued to Orban on Dec. 1, 1992 for "Distortion-Cancellation Circuit For Audio Peak Limiting" (hereafter "the '526 Orban Patent").

The '548 Orban Patent discloses an apparatus and method for peak limiting audio frequency signals. The apparatus and method is used in systems employing high frequency pre-emphasis to compensate for steep high rolloff in a receiver. The apparatus and method is useful in standard AM broadcasting to maximize loudness without noticeable distortion. The distortion is caused by a clipper which is determined by subtracting a clipper's output from its input.

The '266 Orban Patent discloses a peak-limiting apparatus for an audio signal. It provides a control signal to dynamically adjust the level of clipping for an audio signal. A frequency weighted correlation is performed on the audio signal. If the audio signal is found to be highly periodic and correlated, that is, having future values predictable with high probability given knowledge of past values, less clipping is permitted since the clipping of such waveforms are more noticeable. If the evaluation of the audio waveform indicates that the signal is highly uncorrelated such as with bright symphonic music, more clipping is permitted.

The '857 Orban Patent discloses a crossover network. It comprises a first shelving filter, a second shelving filter, a first lowpass filter, a second lowpass filter, a phase corrector and a subtracting means. The first shelving filter receives an audio signal. The second shelving filter is coupled to the output of the first shelving filter. The first lowpass filter is coupled to the output of the first shelving filter. The second lowpass filter and the phase corrector are coupled to the output of the second shelving filter. The subtracting means is used for subtracting two signals coupled to the output of the first and second lowpass filters, and the phase corrector. The band limited crossover network is produced with a high frequency band which is present at the output of the subtraction means and a low frequency band is present at the output of the first lowpass filter.

The '526 Orban Patent discloses a distortion-cancellation circuit for an audio peak limiting. It reduces distortion in a peak limited audio signal. The amount of low-frequency spectral energy in the input signal is determined for a peak limited signal and used to control low-frequencies in the output audio signal.

It is highly desirable to have a method and apparatus to allow an FM audio processor to generate only the "dulling" effect of a (50) microsecond pre-emphasis even when generating a (75) microsecond pre-emphasis curve. It is desirable to provide a method and apparatus of pre-emphasizing an audio signal which is inherently compatible with both the (75) microsecond and (50) microsecond standards. It is also desirable to provide a method and apparatus of pre-emphasizing an audio signal which is easily switchable between the (75) microsecond and (50) microsecond standards.

SUMMARY OF THE INVENTION

The present invention is a novel and unique distributed pre-emphasis equalizer comprising a partial pre-emphasizer means and a (50) microsecond pre-emphasizer means. The partial pre-emphasizer means receives an input signal and produces a partially pre-emphasized output signal. The (50) microsecond pre-emphasizer receives the partially pre-emphasized output signal from the partial pre-emphasizer means and adds a (50) microsecond equalization to produce a pre-emphasized output signal equal to a standard (75) microsecond pre-emphasis curve.

It is an object of the present invention to provide a method and apparatus to allow an FM audio processor to produce only the "dulling" effect of a (50) microsecond pre-emphasis even when generating a (75) microsecond pre-emphasis curve.

It is an additional object of the present invention to provide a method and apparatus to create a pre-emphasizing method which is inherently compatible with both the (75) microsecond and (50) microsecond standards.

It is a further object of the present invention to provide a method and apparatus to create a pre-emphasizing method which is easily switchable between the (75) and (50) microsecond standards.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 4:
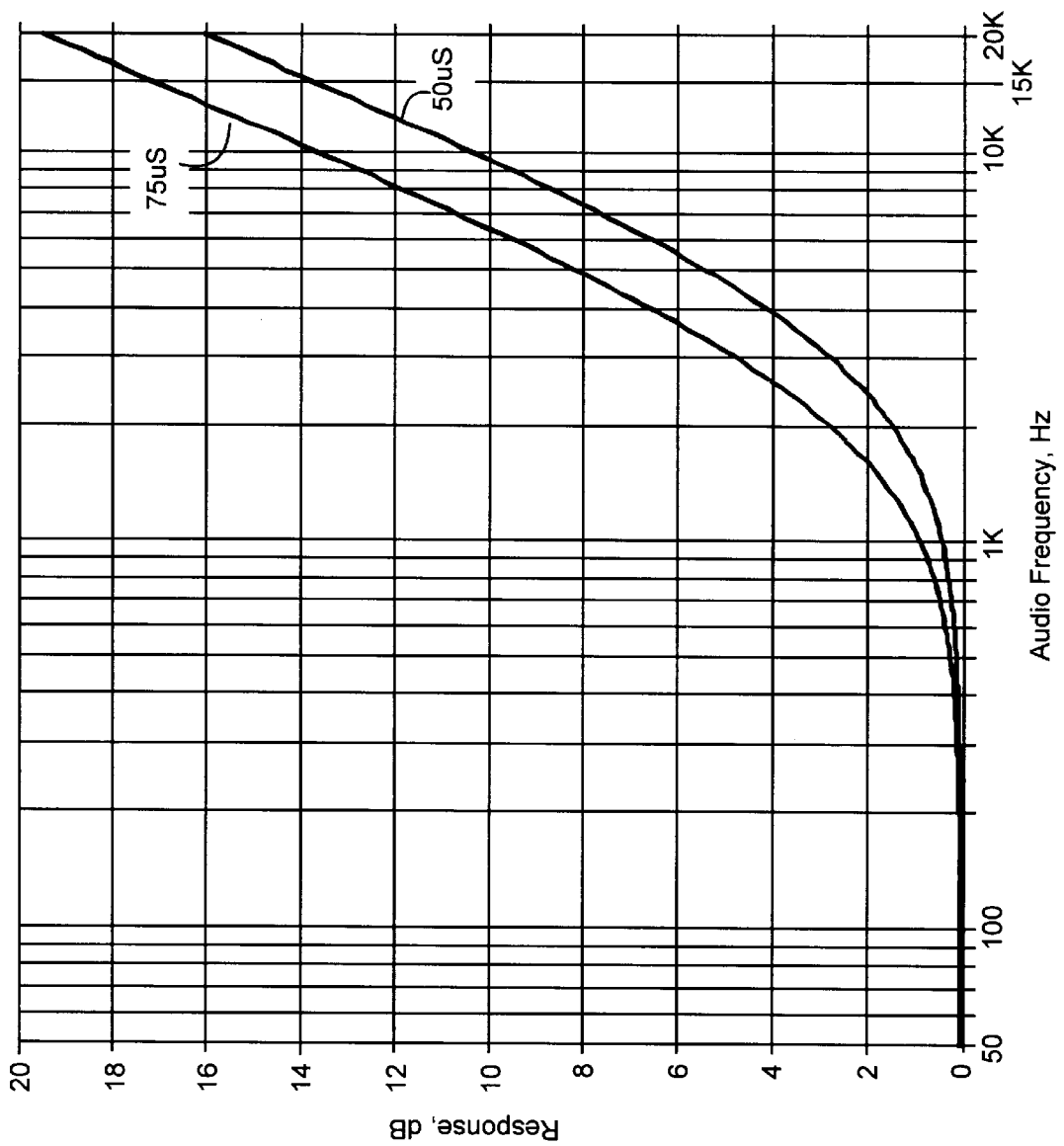
FIG. 4 illustrates a (75) microsecond pre-emphasis curve and (50) microsecond pre-emphasis curve.

Referring to FIG. 4, there is depicted a (50) microsecond pre-emphasis curve and a (75) microsecond pre-emphasis curve for comparison. It can readily be seen that the (50) microsecond pre-emphasis curve generates significantly less high frequency boost above 1KHz than the (75) microsecond curve. In addition, it can be seen that the corner frequency at which boosting significantly begins is lower and embedded more within the mid frequency audio range for the (75) microsecond curve. These two curves explain why, in practice, the (50) microsecond curve generates less audible "dulling" by FM audio processors than the (75) microsecond curve.

Figure 1:
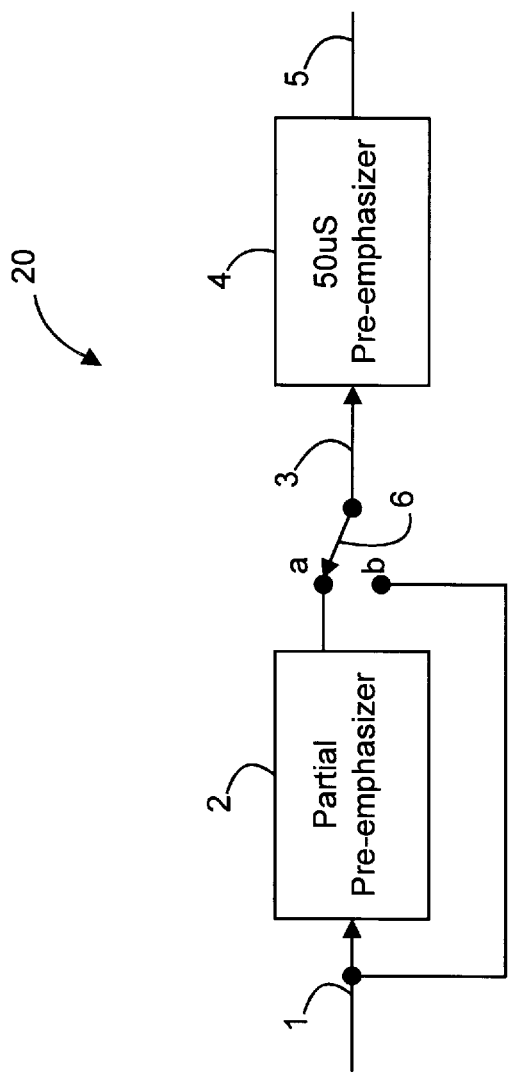
FIG. 1 is a simplified block diagram of the preferred embodiment of the present invention distributed pre-emphasis equalizer (DPE)

Referring to FIG. 1, there is shown at 20 a block diagram of a preferred embodiment of the present invention distributed pre-emphasis equalizer (hereafter referred as "DPE"). The DPE comprises a first partial pre-emphasis equalizer 2 (hereafter the "pre-emphasizer") and a (50) microsecond pre-emphasis equalizer 4 (hereafter the "pre-emphasize"). The first partial pre-emphasizer 2 has an input for receiving an input signal 1 and an output for outputting a partially pre-emphasized signal 3. The (50) microsecond pre-emphasizer 4 has an input for receiving the partially pre-emphasized signal 3 and adding a (50) microsecond equalization, thereby producing a pre-emphasized output signal 5 which is equal to a standard (75) microsecond pre-emphasis curve. It will be appreciated that the (50) microsecond pre-emphasizer 4 may be any conventional or unconventional circuit or network for creating a standard (50) microsecond pre-emphasis curve. It is also within the spirit and scope of the present invention that the (50) microsecond pre-emphasizer 4 may exist not only as a discrete self standing circuit element but also as a function of a peak limiter or pre-emphasis limiter circuit frequently found in FM broadcast audio limiters.

The characteristic equalization of the partial pre-emphasizer 2 may not be obvious, and will next be described in detail. It should be obvious that the (75) microsecond transfer function of the pre-emphasized output signal 5 is generated by the multiplication of the series transfer functions of the partial pre-emphasizer 2 and the (50) microsecond pre-emphasizer 4. Therefore, the transfer function of the partial pre-emphasizer 2 must be equal to the transfer function of the (75) microsecond pre-emphasizer 2 output signal 5 divided by the transfer function of the (50) microsecond pre-emphasizer 4.

It will be appreciated that any network or circuit capable of generating the required transfer function of the partial pre-emphasizer 2 would be suitable. It is also within the spirit and scope of the present invention DPE that the partial pre-emphasizer 2 may exist not only as a discrete self standing circuit element, but also as a function of a processing stage contained within an FM broadcast audio processor.

Referring again to FIG. 1, there is shown a switch 6 for switching the present invention DPE 20 from a (75) microsecond DPE to a simple (50) microsecond pre-emphasis generator. The switch 6 has an "a" position which acts to couple the output of the partial pre-emphasizer 2 to the (50) microsecond pre-emphasizer 4, thereby creating the present invention DPE. The switch 6 also has an "b" position which acts to bypass the partial pre-emphasizer 2, and thereby leaves only the standard (50) microsecond pre-emphasizer 4 in the circuit. In this manner, an audio processor comprising the present invention DPE can be switched between (50) and (75) microsecond pre-emphasis while taking the advantages of the present invention DPE in the (75) microsecond mode. This capability constitutes a useful compatibility feature of the present invention.

Once the partial pre-emphasizer 2 is bypassed, where the switch 6 is in position "b", then the present invention DPE is no longer represented and a conventional pre-emphasis generator is generally illustrated. In other words, the present invention DPE 20 comprises the partial pre-emphasizer 2 as previously described taken in conjunction with the previously described (50) microsecond pre-emphasizer 4 to create the desired (75) microsecond pre-emphasis of output 5.

The distributed nature of the present invention DPE gains its best advantages when the DPE is implemented within an appropriate audio processing architecture.

Figure 2:
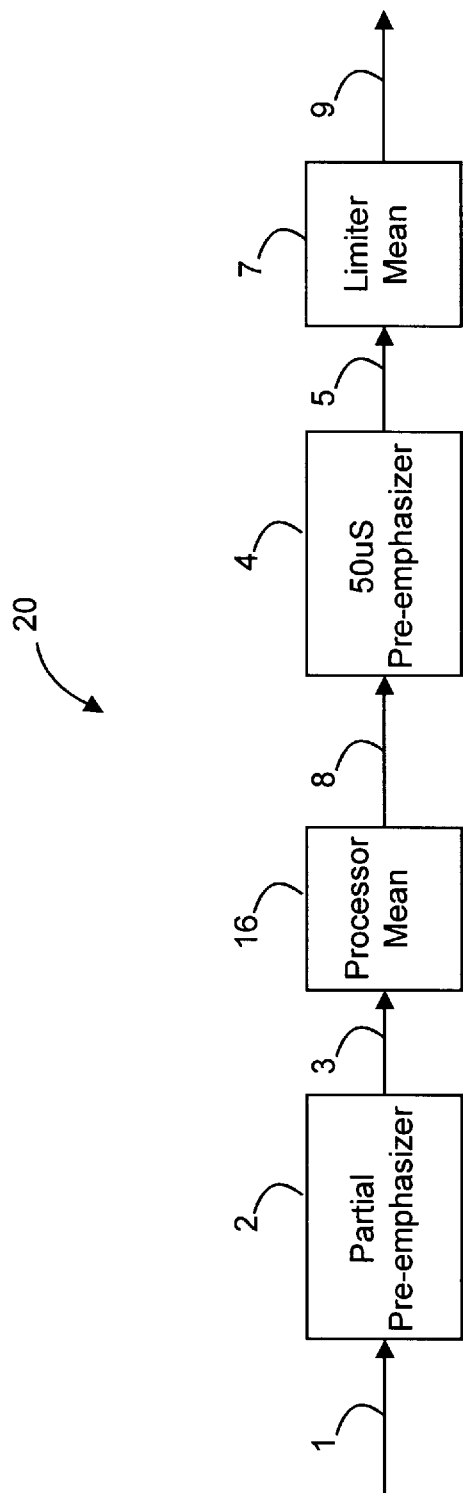
FIG. 2 is a detailed block diagram of the present invention DPE shown in FIG. 1.

Referring to FIG. 2, there is shown a detailed block diagram of the present invention DPE 20 comprising a signal processor means 16 and a limiter means 7 in addition to all of the elements shown in FIG. 1 except for switch 6. It will be appreciated that the processor means 16 may be a multiband compressor or limiter function frequently found in existing FM broadcast audio processors, or may be any new kind of processing means which would establish amplitude control over the partially pre-emphasized output signal 3. It is also within the spirit and scope of the present invention DPE that the limiter means 7 may be a "peak limiter" or "pre-emphasis" limiter frequently found in existing FM broadcast audio processors, or may be any new kind of limiter means which would establish a form of peak modulation control over the pre-emphasized output signal 5.

Referring again to FIG. 2, an input signal 1 is coupled to the input of the partial pre-emphasizer 2 for imparting the partial pre-emphasis of the present invention to the input signal 1. The output of the partial pre-emphasizer 2 is coupled to the input of a processor means 16. The processor means 16 receives the partially pre-emphasized output signal 3 and outputs a processed output signal 8 containing the partial pre-emphasis subject any processing restrictions or constraints such as limiting or compression generated by the actions of the processor means 16. The output of the processor means 16 is coupled to the input of the (50) microsecond pre-emphasizer 4. The (50) microsecond pre-emphasizer 4 receives the processed output signal 8 for adding the (50) microsecond equalization to the processed output signal 8. The (50) microsecond pre-emphasizer output signal 5 contains a (75) microsecond pre-emphasized signal of the present invention DPE comprising a (50) microsecond pre-emphasis characteristic which is not yet peak limited, and a partial pre-emphasis characteristic which has been subjected to amplitude control processing by processor means 16. The output of the (50) microsecond pre-emphasizer 4 is coupled to the input of a limiter means 7 for peak limiting the amplitude of the pre-emphasized output signal 5. Since the partial pre-emphasis characteristic comprising part of the (75) microsecond pre-emphasis has been previously amplitude controlled by processing means 16, the limiter 7 will tend to operate as if the (75) microsecond output signal 8 contained only a (50) microsecond pre-emphasis and therefore will produce less average limiting on high frequency peaks than if the output signal 5 contained a conventional (75) microsecond pre-emphasis characteristic.

Figure 3:
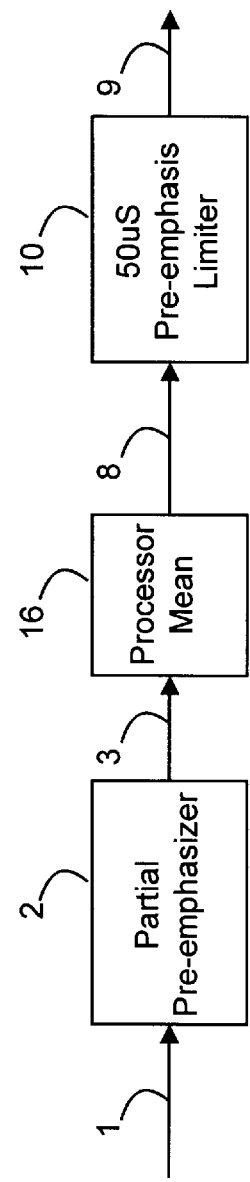
FIG. 3 is a simplified block diagram of an alternative embodiment of the present invention DPE.

Referring to FIG. 3, there is shown an alternative embodiment of the present invention DPE, where the (50) microsecond pre-emphasizer 4 and the limiter 7 shown in FIG. 2 may be combined to form an "integrated pre-emphasis limiter" of conventional or special design whereby the (50) microsecond pre-emphasis is generated as an intrinsic function of limiting. Such pre-emphasis limiters are typically contained in existing FM broadcast audio processors in the form of variable equalizers which either generate a variable shelf or slope, or sliding corner frequency of the pre-emphasis curve.

Figure 5:
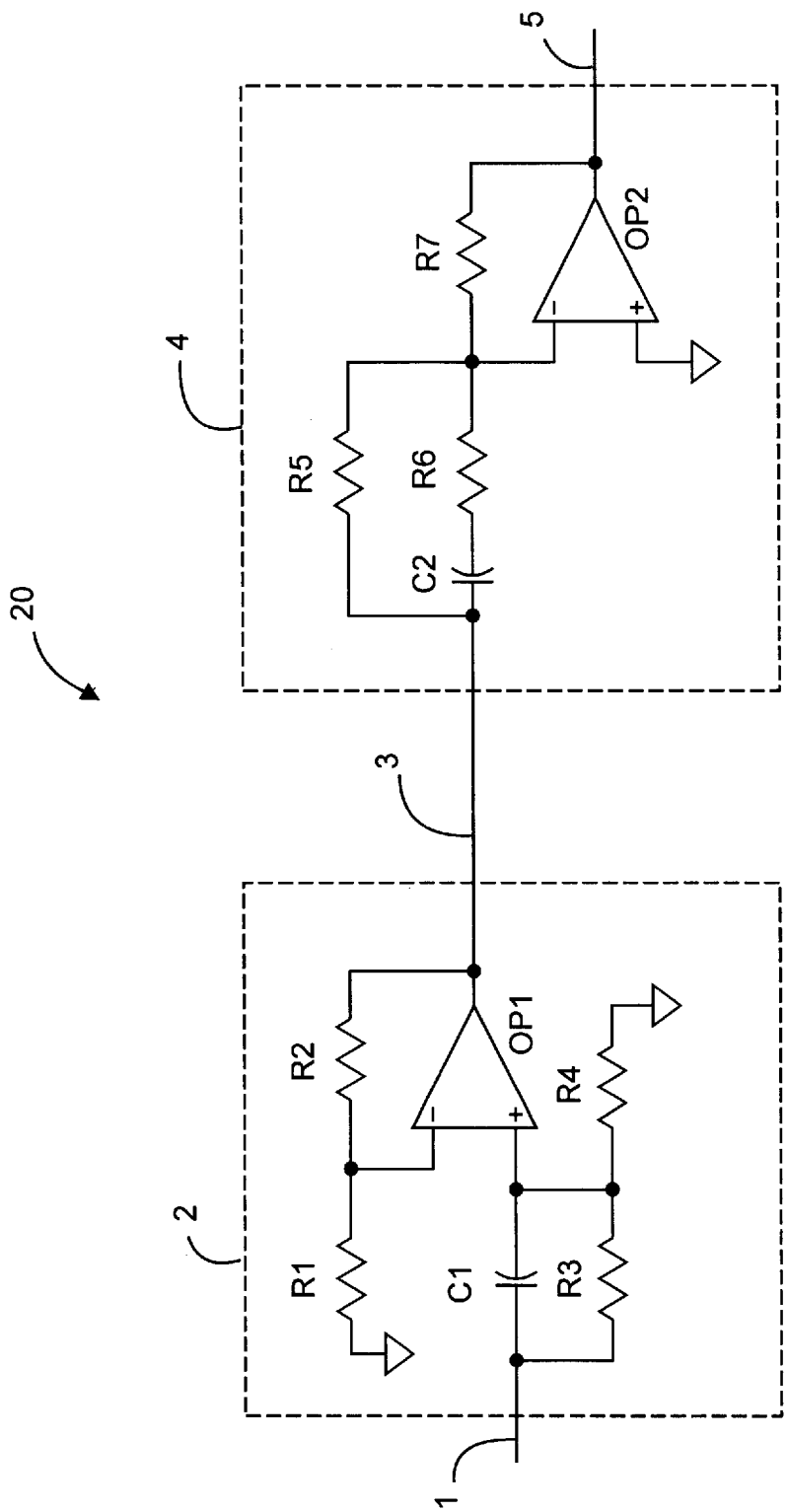
FIG. 5 is a schematic diagram of the preferred embodiment of the present invention DPE shown in FIG. 1.

Referring to FIG. 5, there is shown a preferred embodiment of one of many circuit variations which are possible for the present invention DPE 20. There is shown a partial pre-emphasizer circuit 2 and a (50) microsecond pre-emphasizer circuit 4 which are shown in dashed lines. By way of example only, R1 and R4 are 15 KΩ resistors; R2 and R3 are 7.50 KΩ resistors; R5 and R7 are 4.99 KΩ resistors; R6 is a 499Ω resistor; C1 and C2 are 0.01 µF capacitors; and OP1 and OP2 are type LF353 opamps.

The input signal 1 is coupled to the partial pre-emphasis circuit 2 comprising an OP1, R1, R2, R3, R4, and C1. The network of C1, R3, and R4 generates a partial pre-emphasis transfer function equal to a (75) microsecond equalization characteristic divided by a (50) microsecond equalization characteristic. Resistors R1 and R2 set the opamp gain to unity for low frequencies below the knee of the partial pre-emphasis curve. OP1 outputs the partially pre-emphasized output signal 3.

The partially pre-emphasized output signal 3 is coupled to the input of the (50) microsecond pre-emphasizer circuit 4. The (50) microsecond pre-emphasizer circuit 4 comprises OP2, R5, R6, R7, and C2. Opamp OP2 is configured as an inverting summing amplifier receiving a direct signal through resistor R5 and a frequency boosted signal through capacitor C2. The (50) microsecond pre-emphasis time constant is generated as the product of resistor R5 and capacitor C2. Resistor R6 serves only to limit and stabilize the opamp gain above the audio frequency range of the pre-emphasis curve. When the partially pre-emphasized output signal 3 is coupled directly to the (50) microsecond pre-emphasizer circuit 4, the output signal 5 equals a normal (75) microsecond pre-emphasis characteristic.

Although, the present invention was first intended for use with FM broadcast audio processors, it will be appreciated that the method and apparatus of the present invention will be useful in other applications such as analog and digital recording, 2-way radio, telephony, sonar, or any other application where signal processing may be used in conjunction with pre-emphasis.

Defined in detail, the present invention is a distributed pre-emphasis equalizer, comprising: (a) a first partial pre-emphasizer means having an input for receiving an input signal, an output for producing a partially pre-emphasized output signal, and a transfer function; (b) a signal processor means having an input coupled the output of the first partial pre-emphasizer means for receiving and controlling the amplitude of the partially pre-emphasized output signal, and an output for producing a control partially pre-emphasized output signal; (c) a second pre-emphasizer means having an input, an output and a transfer function, the input coupled to the output of the signal processor means for receiving the control partially pre-emphasized output signal and adding a pre-emphasis characteristic to produce a final pre-emphasized output signal; (d) the transfer function of the first partial pre-emphasizer means being equal to a transfer function of the final pre-emphasized output signal divided by the transfer function of the second pre-emphasizer means; and (e) a limiter means having an input couple to the output of the second pre-emphasizer means for receiving and limiting the amplitude of the final pre-emphasized output signal.

Defined broadly, the present invention is a distributed pre-emphasis equalizer, comprising: (a) a first partial pre-emphasizing means for receiving an input signal and producing a partially pre-emphasized output signal; (b) a processor means for receiving and controlling the amplitude of the partially pre-emphasized output signal and producing a controlled partially pre-emphasized output signal; (c) a second pre-emphasizing means for receiving the controlled partially pre-emphasized output signal of the processor means and adding a pre-emphasis characteristic to produce a final pre-emphasized output signal; and (d) the first partial pre-emphasizing means further having a transfer function being equal to a transfer function of the final pre-emphasized output signal divided by a transfer function of the second pre-emphasizing means.

Defined more broadly, the present invention is a distributed pre-emphasis equalizer, comprising: (a) a first partial pre-emphasizing means for receiving an input signal and producing a partially pre-emphasized output signal; (b) a second pre-emphasizing means for receiving the partially pre-emphasized output signal and adding a pre-emphasis characteristic to produce a final pre-emphasized output signal; and (c) the first partial pre-emphasizing means having a transfer function being equal to a transfer function of the final pre-emphasized output signal divided by a transfer function of the second pre-emphasizing means.

Defined even more broadly, the present invention is a distributed pre-emphasis equalizer, comprising: (a) a first pre-emphasizing means for receiving an input signal and producing a pre-emphasized output signal; and (b) a second pre-emphasizing means for receiving the pre-emphasized output signal and adding a pre-emphasis characteristic to produce a final pre-emphasized output signal.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A distributed pre-emphasis equalizer, comprising:
   a. a first partial pre-emphasizer means having an input for receiving an input signal, an output for producing a partially pre-emphasized output signal, and a transfer function;
   b. a signal processor means having an input coupled with said output of said first partial pre-emphasizer means for receiving and controlling the amplitude of said partially pre-emphasized output signal, and an output for producing a control partially pre-emphasized output signal;
   c. a second pre-emphasizer means having an input, an output and a transfer function, the input coupled to said output of said signal processor means for receiving said control partially pre-emphasized output signal and adding a pre-emphasis characteristic to produce a final pre-emphasized output signal;
   d. said transfer function of said first partial pre-emphasizer means being equal to a transfer function of said final pre-emphasized output signal divided by said transfer function of said second pre-emphasizer means; and
   e. a limiter means having an input coupled to said output of said second pre-emphasizer means for receiving and limiting the amplitude of said final pre-emphasized output signal.

2. The distributed pre-emphasis equalizer in accordance with claim 1 wherein said final pre-emphasized output signal is equal to a transfer function of a (75) microsecond pre-emphasis curve.

3. The distributed pre-emphasis equalizer in accordance with claim 1 wherein said pre-emphasis characteristic is equal to a transfer function of a (50) microsecond pre-emphasis curve.

4. A distributed pre-emphasis equalizer, comprising:
   a. a first partial pre-emphasizing means for receiving an input signal and producing a partially pre-emphasized output signal;
   b. a processor means for receiving and controlling the amplitude of said partially pre-emphasized output signal and producing a controlled partially pre-emphasized output signal;
   c. a second pre-emphasizing means for receiving said controlled partially pre-emphasized output signal of said processor means and adding a pre-emphasis characteristic to produce a final pre-emphasized output signal; and
   d. said first partial pre-emphasizing means further having a transfer function being equal to a transfer function of said final pre-emphasized output signal divided by a transfer function of said second pre-emphasizing means.

5. The distributed pre-emphasis equalizer in accordance with claim 4 further comprising a limiter means coupled to said second pre-emphasizing means for limiting the amplitude of said final pre-emphasized output signal.

6. The distributed pre-emphasis equalizer in accordance with claim 4 wherein said final pre-emphasized output signal is equal to a transfer function of a (75) microsecond pre-emphasis curve.

7. The distributed pre-emphasis equalizer in accordance with claim 4 wherein said pre-emphasis characteristic is equal to a transfer function of a (50) microsecond pre-emphasis curve.

8. A distributed pre-emphasis equalizer, comprising:
   a. a first partial pre-emphasizing means for receiving an input signal and producing a partially pre-emphasized output signal;
   b. a second pre-emphasizing means for receiving said partially pre-emphasized output signal and adding a pre-emphasis characteristic to produce a final pre-emphasized output signal; and
   c. said first partial pre-emphasizing means having a transfer function being equal to a transfer function of said final pre-emphasized output signal divided by a transfer function of said second pre-emphasizing means.

9. The distributed pre-emphasis equalizer in accordance with claim 8 further comprising a signal processor means coupled between said first partial pre-emphasizing means and said second pre-emphasizing means for receiving and controlling the amplitude of said partially pre-emphasized output signal.

10. The distributed pre-emphasis equalizer in accordance with claim 8 further comprising a limiter means coupled to said second pre-emphasizing means for limiting the amplitude of said final pre-emphasized output signal.

11. The distributed pre-emphasis equalizer in accordance with claim 8 wherein said final pre-emphasized output signal is equal to a transfer function of a (75) microsecond pre-emphasis curve.

12. The distributed pre-emphasis equalizer in accordance with claim 8 wherein said pre-emphasis characteristic is equal to a transfer function of a (50) microsecond pre-emphasis curve.

13. A distributed pre-emphasis equalizer, comprising:
   a. a first pre-emphasizing means for receiving an input signal and producing a pre-emphasized output signal; and
   b. a second pre-emphasizing means for receiving said pre-emphasized output signal and adding a pre-emphasis characteristic to produce a final pre-emphasized output signal;
   wherein said first partial pre-emphasizing means having a transfer function being equal to a transfer function of said final pre-emphasized output signal divided by a transfer function of said second pre-emphasizing means.

14. The distributed pre-emphasis equalizer in accordance with claim 13 further comprising a signal processor means coupled between said first partial pre-emphasizing means and said second pre-emphasizing means for receiving and controlling the amplitude of said pre-emphasized output signal.

15. The distributed pre-emphasis equalizer in accordance with claim 13 further comprising a limiter means coupled to said second pre-emphasizing means for limiting the amplitude of said final pre-emphasized output signal.

16. The distributed pre-emphasis equalizer in accordance with claim 13 wherein said final pre-emphasized output signal is equal to a transfer function of a (75) microsecond pre-emphasis curve.

17. The distributed pre-emphasis equalizer in accordance with claim 13 wherein said pre-emphasis characteristic is equal to a transfer function of a (50) microsecond pre-emphasis curve.

* * * * *